(12) United States Patent
Butler

(10) Patent No.: US 7,126,674 B2
(45) Date of Patent: Oct. 24, 2006

(54) POSITIONING DEVICE AND DEVICE MANUFACTURING METHOD

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 199 days.

(21) Appl. No.: 10/866,076

(22) Filed: Jun. 14, 2004

(65) Prior Publication Data

US 2005/0275822 A1    Dec. 15, 2005

(51) Int. Cl.
 G03B 27/58 (2006.01)
 G03B 27/42 (2006.01)
 G03B 27/62 (2006.01)

(52) U.S. Cl. .............................. 355/72; 355/53; 355/75

(58) Field of Classification Search ................. 355/53, 355/72, 75

See application file for complete search history.

(56) References Cited

U.S. PATENT DOCUMENTS

| | | | | |
|---|---|---|---|---|
| 6,493,062 B1* | 12/2002 | Tokuda et al. | ................. | 355/53 |
| 6,538,720 B1* | 3/2003 | Galburt et al. | ................. | 355/53 |
| 6,597,434 B1* | 7/2003 | Van Dijsseldonk | .......... | 355/75 |
| 6,906,786 B1* | 6/2005 | Cox et al. | ...................... | 355/53 |

\* cited by examiner

*Primary Examiner*—Alan Mathews
(74) *Attorney, Agent, or Firm*—Pillsbury Winthrop Shaw Pittman, LLP

(57) ABSTRACT

A positioning device for positioning an object that includes a first actuator and a connector arranged between the first actuator and the object. The connector includes a resilient member and a second actuator connected in series with the resilient member. The first actuator being constructed and arranged to exert a force in a first direction on the connector and the second actuator is controlled to maintain a distance between the first actuator and the object in the first direction substantially constant.

3 Claims, 13 Drawing Sheets

POSITIONING DEVICE AND DEVICE MANUFACTURING METHOD

BACKGROUND OF THE INVENTION

1. Field of the Invention

The present invention relates to a positioning device for positioning an object and an associated device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Typically, a lithographic apparatus is equipped with a plurality of positioning devices. These devices may be applied to accurately position or displace an object table provided with a patterning device or a substrate or to accurately position an object, such as an optical element, which may comprise lens elements or mirrors.

In order to accurately position or displace the object or object table, the actuators are electromagnetic actuators or linear motors, planar motors, piezo-electric actuators, pneumatic or hydraulic actuators.

Often, these actuators are not directly attached to the object or object table that requires accurate positioning. Instead, a connector comprising a resilient member is arranged between the first actuator (or actuators) and the object. As an example, the actuators or the drive arrangement may be connected to the object or object table by means of leaf springs. One reason for applying these connections is to avoid the mechanical connection between the drive arrangement and the object or object table becomes overdetermined. By applying such resilient members (e.g. leaf springs) between the actuator and object table mechanical stresses in the object or object table due to thermal deformations of the actuator may be reduced or avoided. It should be noted that the resilient member may not be introduced on purpose or as a separate item between the first actuator and the object, but may represent a part of the mechanical construction having a lack of constructional stiffness as a consequence of limitations in the mechanical design.

A drawback of the positioning device as described is that the finite stiffness between the drive arrangement and the driven object causes a relative displacement between the object that is driven and the drive arrangement due to deformation of the resilient member. This deformation may affect the positioning accuracy of the object or the time necessary to obtain the required accuracy (i.e. settle time). Such a deformation of the resilient member may, for example, comprise a compression or elongation.

SUMMARY OF THE INVENTION

The principles of the present invention, as embodied and broadly described herein, provide for an improved drive arrangement where the relative displacement of the driven object and the driving actuator is, at least partly, compensated. In one embodiment, positioning device is provided, which comprises a first actuator; and a connector, arranged between the first actuator and the object, in which the first actuator is configured to exert a force on the connector along a first direction. The connector comprising a resilient member; and a second actuator connected in series with the resilient member. The second actuator is configured to control a dimension of its body along the first direction based on information regarding a dimension of the resilient member along the first direction.

In a positioning device as described by the present invention, the relative position between the object and the first actuator can be controlled. This may result in a more accurate positioning of the object. Examples of such objects may be an optical element in a lithographic apparatus or an object table provided with a substrate or a reticle in a lithographic apparatus.

A deformation of a resilient member between the first actuator and the object may affect the absolute positioning or the required displacement of an object or object table. In case this deformation is caused by forces exerted on the resilient member by either the actuator or the object (e.g. inertial forces), this deformation may vary rapidly over time resulting in a positional error of the object or object table. This positional error may, at least partly, be alleviated by controlling the dimension of the second actuator in the first direction.

It is noted that a relative displacement of the object and the actuator may also be caused by e.g. a thermal deformation of the actuator. These effects however occur on a much larger time-scale (i.e. they occur much slower) and are therefore easily compensated/controlled by a conventional position controller. Dynamic effects such as the variation of the actuator force exerted on the connector causing it to deform, occur on a much smaller time-scale. Compensation of these effects would required a time consuming control effort if these effects are not compensated. Therefore, it should also be noted that the present invention may also advantageously affect the productivity of the apparatus using the positioning device. When applied in a lithographic apparatus, it may result in an increased number of substrates processed per unit of time.

In a further embodiment of the present invention, the dimension of the second actuator is controlled to maintain a substantially constant distance between the first actuator and the object in the first direction. In this way, the deformation of the resilient member can be compensated by a deformation of the second actuator resulting in a relative position between the first actuator and the object that remains substantially constant. Such an arrangement may advantageously affect the positional accuracy and productivity of the positioning device or the apparatus applying the positioning device. These effects can be illustrated as follows:

Depending on the process, an object or an object table holding an object may require accurate displacement and positioning. The object may, as an example, be required to follow a predefined trajectory that may include a first phase of accelerating the object or object table, a second phase of maintaining the object table at a substantially constant speed and a third phase of decelerating the object table. This process can, as an example, be found in a lithographic apparatus.

During acceleration or deceleration of the object or object table in the first direction, a resilient member that is constructed between the object or the object table and the actuator will, to some extend become compressed or elongated. This will occur even at a comparatively high value of the stiffness of the resilient member in the first direction. To illustrate this, a 16 kg object table provided with a substrate is accelerated by a drive arrangement with an acceleration of 10 m/s$^2$. The resilient member between the object table and the drive arrangement has a stiffness Cs in the drive direction of Cs=10$^8$ N/m. In order to accelerate the object table, a force of 160 N is exerted via the resilient member. Due to this force, the resilient member will compress over approx. 1.6 μm.

In case the object table is to follow a constant velocity trajectory after the acceleration phase, the resilient member will return to its original length once the acceleration force is no longer present. This will result in a positional error of the object table, this error may be larger than the acceptable error margin for positioning the substrate. Thus, the object table may require re-positioning by the drive arrangement. It will therefore take more time to accurately position the substrate (i.e. the time to bring the substrate within the allowable error bandwidth (settle time) will increase) and therefore, less substrates per unit of time can be processed. When a positioning device according to the present invention is used, the compression or elongation of the resilient member can at least partly be compensated by the second actuator. By doing so, the positioning accuracy of the substrate can be improved and the settle time for accurate positioning can be reduced. The latter may lead to an increased number of substrates processed per unit of time, i.e. an increase in productivity. It should be noted that the resilient member may be a mechanical connection having a comparatively high stiffness in the first direction and a comparatively low stiffness in a direction perpendicular to the first direction (in case the resilient member comprises e.g. a leaf spring). In general however, any mechanical part between the first actuator and the object to be positioned or displaced, may be considered a resilient member.

In an embodiment of the present invention, the resilient member has a first stiffness in the first direction and a second stiffness in a direction perpendicular to the first direction, the second stiffness being substantially smaller than the first stiffness. By doing so, the transmission of vibrations of the first actuator in a direction perpendicular to the first direction is attenuated. Furthermore, mechanical stresses in the object or object table due to deformation of the first actuator may be attenuated due to the substantially smaller stiffness in a direction perpendicular to the first direction. By connecting the object and the drive arrangement to each other by means of one or more resilient members having a comparatively high stiffness in the first direction and a comparatively low stiffness in a direction perpendicular to the first direction, one may avoid that the mechanical connection between the object and the drive arrangement becomes overdetermined.

In an embodiment of the present invention, the second actuator comprises a piezo-electric actuator. In such an arrangement, the compression or elongation of the resilient member is at least partly compensated by an elongation or compression of the piezo-electric actuator. An advantage of applying a piezo-electric actuator is that the actuator itself has a comparatively high stiffness and that the actuator can be controlled over a high bandwidth. An other example of an actuator having such properties is a magneto-strictive actuator.

In an embodiment of the present invention, the first actuator is an electromagnetic actuator, such as a Lorentz actuator or a voice coil motor. Positioning an object by means of an electromagnetic actuator improves the positioning accuracy since vibrations may be attenuated. In general, the positioning device may be mounted on a frame or a linear motor or a planar motor that may be subject to vibrations. Because electromagnetic actuators such as Lorentz actuators or voice coil motors comprise a first part and a second part without a mechanical contact between them, vibrations occurring on the first part of the actuator (i.e. the part attached to the frame, or to an additional motor), are virtually not transmitted to the second part that is connected, by means of the connector, to the object or object table.

In the present invention, the input signal for controlling the second actuator can be obtained in various ways.

In an embodiment of the present invention, the relative displacement between the first actuator and the object in the first direction is measured. Based upon this measurement an input signal to control the deformation of the second actuator can be generated. The deformation of the second actuator can thus be arranged to ensure that the measured relative displacement in the first direction remains substantially constant.

In an embodiment of the present invention, the input signal (to determine the required deformation of the second actuator) may also be obtained from either the required acceleration of the object and/or from the force requirement of the first actuator. The latter may be obtained from a position controller output. Based upon the required acceleration or the actuator force, the deformation of the resilient member can be predicted. The required deformation of the second actuator to, at least partly, compensate the deformation of the resilient member can thus be determined. In this arrangement, the required deformation of the second actuator is obtained from the actuator force (or acceleration) and the mechanical properties of the resilient member (e.g. the stiffness) in the first direction.

In an embodiment of the present invention, the force acting on the resilient member in the first direction (and causing the deformation in the first direction) is measured. As an example, this can be done using a piezo-electric sensor. From this force measurement the input signal for controlling the deformation of the second actuator can be derived. By doing so, the deformation of the resilient member in the first direction can, at least partly, be compensated.

It should be noted that the different ways of obtaining the required input signal for controlling the second actuator may also be combined.

In an embodiment of the present invention, the positioning device according to the present invention is applied in a lithographic apparatus for accurately positioning an object table provided with either a patterning means or a substrate.

According to a further embodiment, there is provided a device manufacturing method comprising providing a substrate that is at least partially covered by a layer of radiation-sensitive material; conditioning a beam of radiation using a radiation system; configuring the beam of radiation with a desired pattern in its cross-section based on a patterning device; and positioning the substrate or the patterning device via a positioning device. The positioning device comprises a first actuator and a connector comprising a resilient member and a second actuator connected in series with the resilient member, the connector arranged between the first actuator and the substrate or the patterning device. The first actuator is configured to exert a force on the connector along a first direction and the second actuator is controlled to maintain a distance between the first actuator and the substrate or the patterning device in the first direction substantially constant.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning means, the design of the lithographic apparatus, and other conditions, such as for example whether or not the patterning means is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Although embodiments of the positioning device of the present invention will be described within the context of a lithographic apparatus for clarity, it will be appreciated that the positioning device, as disclosed, may be equally applied to other technologies and/or systems.

Figure 1:
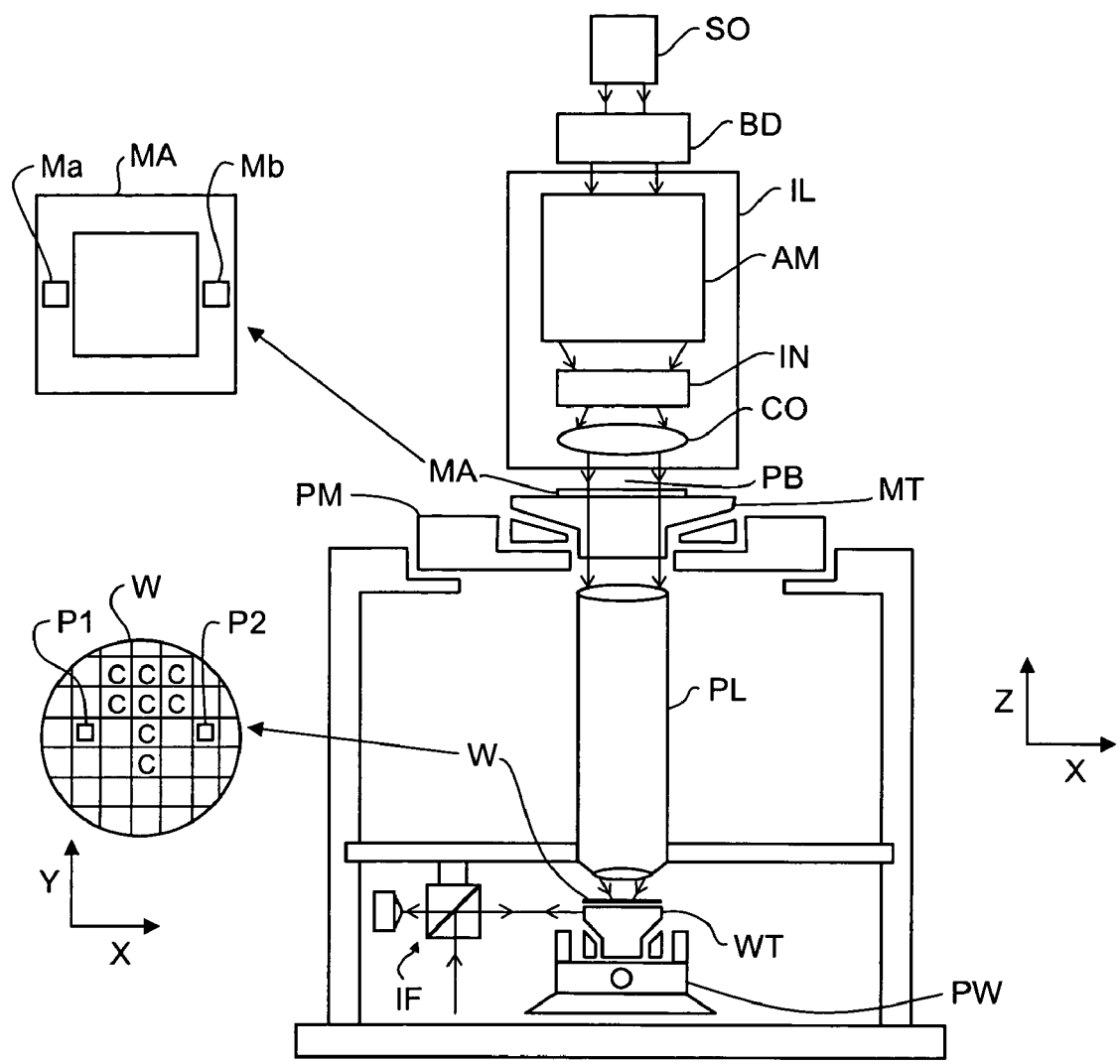
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL: for providing a projection beam PB of radiation (e.g. UV or EUV radiation).

a first support structure (e.g. a mask table/holder) MT: for supporting patterning device (e.g. a mask) MA and connected to first positioning mechanism PM for accurately positioning the patterning device with respect to item PL;

a substrate table (e.g. a wafer table/holder) WT: for holding a substrate (e.g. a resist-coated wafer) W and connected to second positioning mechanism PW for accurately positioning the substrate with respect to item PL; and a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. or a programmable mirror array of a type as referred to above).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
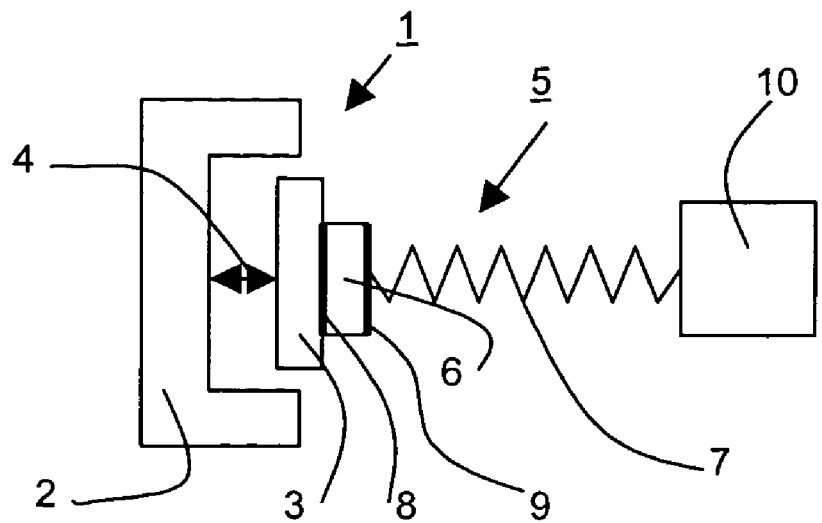
FIG. 2 schematically depicts a first embodiment of a positioning device according to the present invention.

FIG. 2 schematically depicts a positioning device according to an embodiment of the present invention. FIG. 2 schematically depicts a first actuator 1, comprising a first part 2 and a second part 3. The first actuator 1 can generate a force between the first part 2 and the second part 3 along the direction indicated by arrow 4. The second part 3 of the first actuator 1 is connected to a connector 5 that comprises a second actuator 6 and a resilient member 7. The connector connects the first actuator 1 with an object 10.

The first actuator 1 can, for an example, comprise an electromagnetic actuator, such as, a Lorentz actuator or a voice coil motor, or an hydraulic or pneumatic actuator. The first part 2 of the first actuator 1 can be mounted, for an example, on a frame or a balance mass or can be mounted on a second positioning device such as a linear motor or a planar motor. The latter arrangement is often applied in a lithographic apparatus. Such an arrangement enables both the displacement of an object or object table (e.g. a mask table or substrate table) over comparatively large distances by the linear motor or planar motor and an accurate positioning of the object or object table relative to the projection system by the positioning device. In general, such a positioning device will enable the positioning of the object or object table in one or more degrees of freedom.

By actuating the second actuator 6, a first end 8 of the second actuator 6 can be displaced relative to a second end 9. Such a displacement, corresponds to the compression or elongation of the second actuator 6 along the direction indicated by the arrow 4, and can be applied to, at least partly, compensate for the elongation or compression of the resilient member 7.

Figure 3:
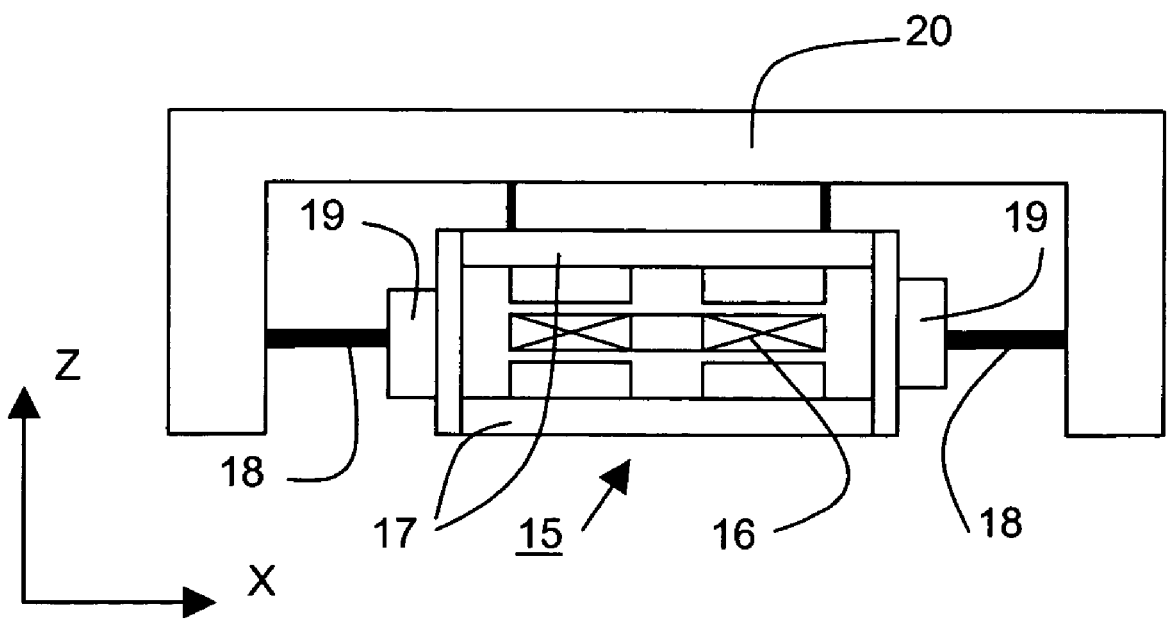
FIG. 3 schematically depicts a second embodiment of a positioning device according to the present invention.

FIG. 3 schematically depicts an embodiment of the present invention, comprising a Lorentz actuator 15 that includes a coil 16 and two magnet plates 17. The Lorentz actuator 15 is connected to an object table 20 by a set of leaf springs 18 and two actuators 19. By energizing the Lorentz actuator 15, a force can be exerted on the object table 20 in the X-direction via the leaf springs 18 and the actuators 19. As in the example of FIG. 2, the compression or elongation of the leaf springs 18 (in the X-direction) can, at least partly, be compensated by the elongation or compression of the actuators 19 in the X-direction.

In order to respond to the compression or elongation of the leaf spring(s) or resilient member, it may be preferred to configure the second actuator to have a comparatively fast response time. It may also be preferred that the second actuator have a high stiffness, that is, that the actuator itself experience little to no compression or elongation by the force of the first actuator. Examples of such actuators are piezo-electric actuators or magneto-strictive actuators.

Figure 4A:
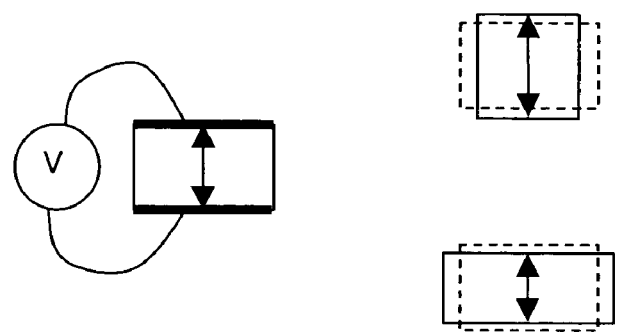
FIG. 4a schematically depicts the deformation of a piezo-electric actuator that is polarized in longitudinal direction.
Figure 4B:
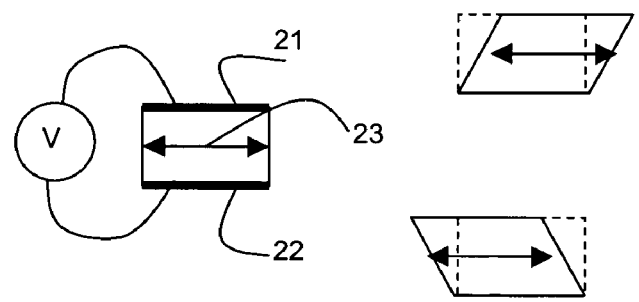
FIG. 4b schematically depicts the deformation of a piezo-electric actuator that is polarized in transversal direction.

FIGS. 4a and 4b schematically depict how a piezo-electric actuator can be applied in order to generate a deformation in a predefined direction.

FIG. 4a schematically depicts a piezo-actuator connected to a voltage or charge-supply. As indicated by the arrow (representing the polarization of the piezo-electric element), the application of a voltage to the piezo-electric actuator may result in the elongation of the actuator (upper right part of FIG. 4a) or the compression of the actuator (lower right part of FIG. 4a).

Depending on the polarization of the piezo-electric material, the deformation of the piezo-electric actuator may also be one of shearing instead of compression or elongation. This is illustrated in FIG. 4b. By energizing the piezo-actuator, the top and bottom planes 21, 22 of the actuator can displace relative to each other in the direction indicated by the arrow 23, as indicated in the upper right part of FIG. 4b and the lower right part of FIG. 4b. Both types of piezo-electric actuators (shown in FIGS. 4a and 4b) can be applied in the present invention. Piezo-electric actuators as shown in FIG. 4a may, for example, be applied to the embodiments shown in FIGS. 2 and 3.

Figure 4C:
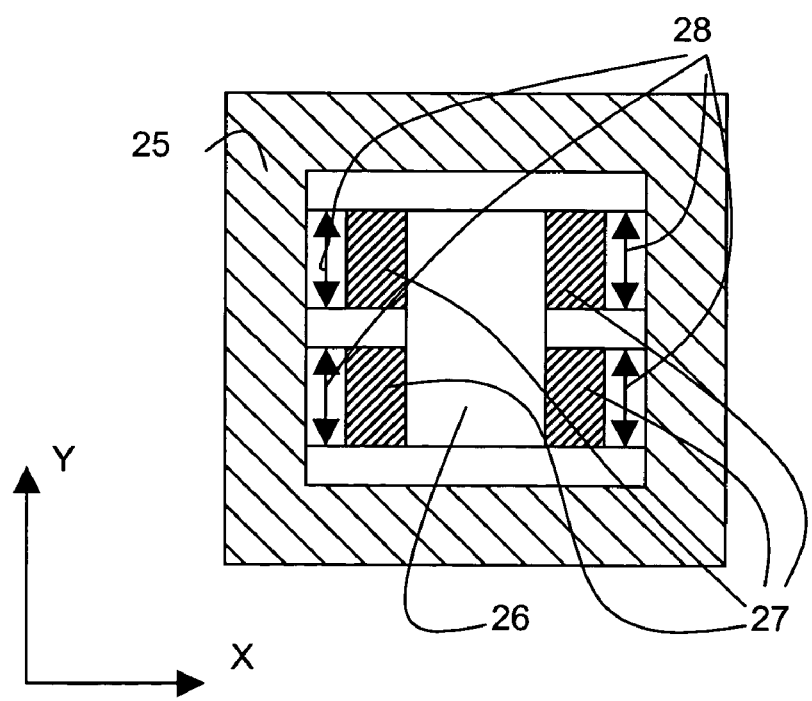
FIG. 4c schematically depicts a drive arrangement comprising four piezo-electric actuators.
Figure 4D:
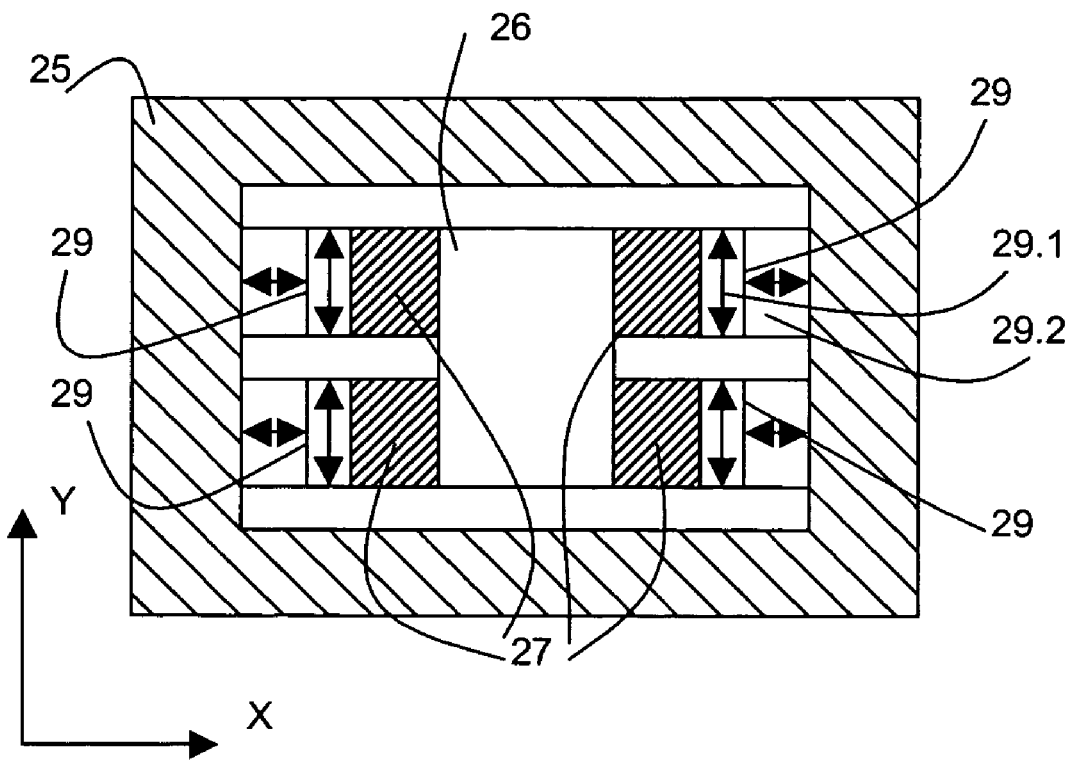
FIG. 4d schematically depicts a drive arrangement comprising eight piezo-electric actuators.

Other arrangements are illustrated in FIGS. 4c and 4d. FIG. 4c schematically depicts a drive arrangement comprising an object 25 to be displaced and a first part of an actuator 26. The actuator is connected to the object by means of four leaf springs 27 and four piezo-electric actuators 28. The piezo-electric actuators are polarized in such a way that they can deform in a shearing manner, as indicated in FIG. 4b. In the arrangement shown, a relative displacement between the object and the actuator in the Y-direction can be realized. The actuator 26 is constructed to displace the object in the Y-direction. When a force is exerted on the first part of the actuator 26, this part will move in the Y-direction, taking the object 25 along. Due to the finite stiffness of the leaf springs 27 in the Y-direction, a relative displacement between the object 25 and the actuator part 26 will occur. This relative displacement can, at least partly, be compensated by appropriately controlling the piezo-electric actuators 28.

It should be noted that both types of piezo-electric actuator as shown in FIGS. 4a and 4b may also be combined. By doing so, deformations of the resilient member in a second direction, substantially perpendicular to the first direction, may also be, at least partly, compensated. Such an arrangement may advantageously be applied in case planar displacements of the object are required. FIG. 4d schematically depicts such an arrangement. In this arrangement, the object 25 is connected to the actuator part 26 by means of four leaf springs 27, four piezo-electric actuators 29.1 for providing a shearing displacement and four piezo-actuators 29.2 for providing a longitudinal displacement. In this arrangement, the object is assumed to be displaceable in the XY-plane by the actuator. Such a two-dimensional displacement can be realized by arranging a plurality of linear actuators such as Lorentz actuators or reluctance actuators. A two-dimensional displacement can also be realized by means of a planar motor.

In the arrangement shown in FIG. 4d, a deformation of the leaf springs (due to the force exerted by the actuator) in either the X-direction or the Y-direction or any direction in the XY-plane, can, at least partly, be compensated by a deformation of either the piezo-electric actuators 29.1 or the piezo-electric actuators 29.2 or both.

Figure 4E:
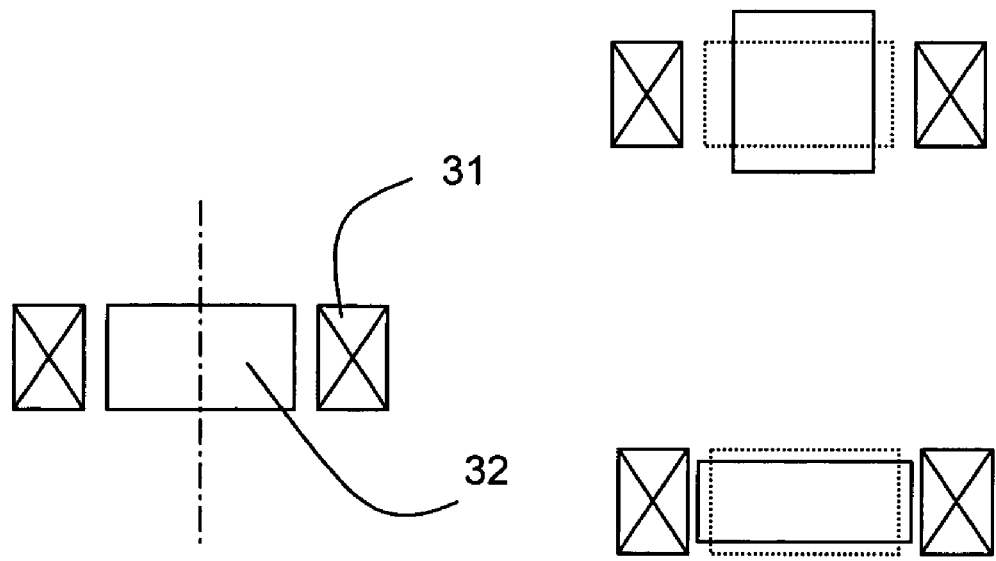
FIG. 4e schematically depicts the deformation of a magneto-strictive actuator.

FIG. 4e schematically depicts a magneto-strictive actuator comprising of a coil 31 enclosing a magneto-strictive element 32. By energizing the actuator, the magneto-strictive element can be compressed or elongated, as indicated in the upper right corner and the bottom right corner of FIG. 4e. By doing so, the compression or elongation of a resilient member of a positioning device can, at least partly, be compensated. In this way, the magneto-strictive actuator may be applied, as an example, in the embodiments shown in FIG. 2 or 3.

Figure 5A:
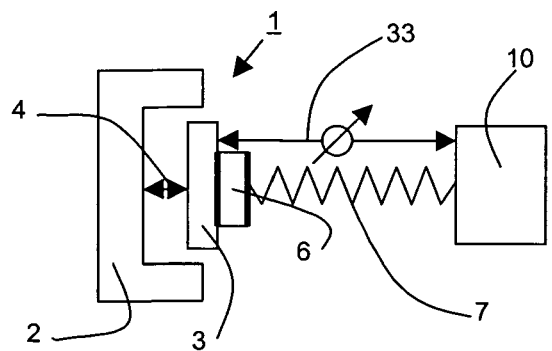
FIG. 5a schematically depicts an embodiment of the present invention including a measurement system between the first actuator and the object FIG. 5b schematically depicts an embodiment of the present invention including a force sensor between the object and the resilient member.

In order to provide the required deformation of the second actuator, the positioning device may be equipped with a measurement system 33 (see, FIG. 5a) for measuring the relative displacement of the object and the first actuator due to deformation of the resilient member. Such a measurement system may, as an example comprise capacitive or inductive sensors, encoder based measurement systems, interferometer systems, etc.

Figure 5B:
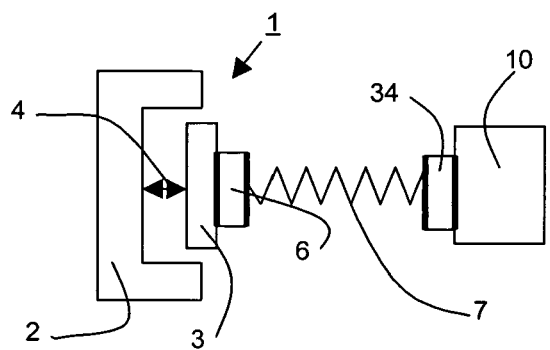

The deformation of the resilient member may also be derived from a force measurement or mechanical stress measurement of the resilient member (see, FIG. 5b). The force acting on the resilient member in the first direction may, as an example, be obtained from a force sensor 34 connected between the resilient member and the object. Such a sensor may, as an example, be a piezo-electric sensor. FIG. 5b schematically illustrates such a setup. It should be noted that the force sensor may also be connected between the second actuator and the resilient member or between the second actuator and the first actuator.

The deformation of the resilient member may also be predicted from the required acceleration profile of the object. Based on the required acceleration of the object or on the output of a position controller and the mechanical properties of the resilient member, the required deformation of the second actuator (to, at least partly, compensate the deformation of the resilient member) can be calculated/predicted.

Figure 6:
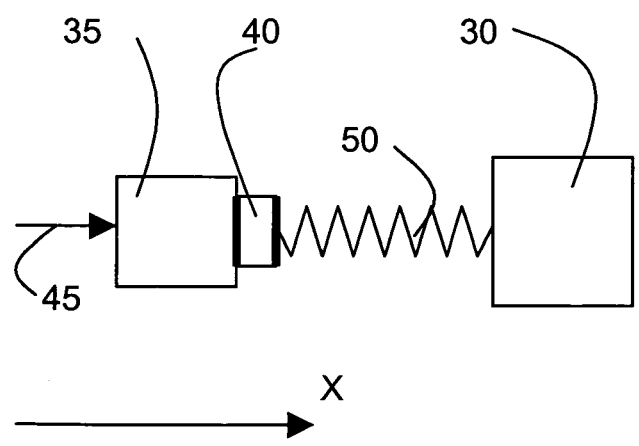
FIG. 6 schematically depicts a simulation model of an embodiment of the present invention.

The impact of such an arrangement on the performance of the positioning device is illustrated in FIGS. 6 to 13 by means of simulations. FIG. 6 schematically describes the configuration and setup for the simulations. In FIG. 6, item 30 represents the object to be positioned. The object is connected to a part 35 of a first actuator (e.g. the magnet yoke of a Lorentz actuator) by means of a connector comprising a resilient member 50 and a second actuator (e.g. a piezo-electric actuator) 40. In order to displace the object 30, the first actuator exerts a force (depicted by the arrow 45) on the object via the connector.

So, the actuating force is applied to a first mass 35 (e.g. the magnet yoke) while the actual object to be moved/positioned (e.g. an object table provided with a substrate or a patterning means) is connected to the actuator via the second actuator 40 and the resilient member 50, the connection having a spring constant (or stiffness) C being the combination of the stiffness of the second actuator 40 and the resilient member 50.

In this setup, it is assumed that the position of the object 30 is to be controlled (i.e. the X-position in the one-dimensional example of FIG. 6). In general, this X-position may be measured by a position measurement system, and fed back to the actuator control unit by means of a control loop (to control and, if required, adjust the generated force). By properly designing the controller, e.g. by designing a correct phase at the resonance frequency, the resonance in the system does not result in an unstable feedback loop.

The following parameters are considered to simulate the impact of the second actuator on the performance of the positioning device:

| | |
|---|---|
| mass of the actuator part 35 ($M_1$) | 4 kg |
| mass of the object 30 ($M_2$) | 16 kg |
| required acceleration | 12 m/s² |
| stiffness C | $10^8$ N/m |

Applying these parameters, the resilient member would be compressed over a distance of approx. 1.92 μm. In the absence of the second actuator, the control unit will reduce this position error by adjusting the actuator force such that the object follows the required profile. However, at the end of the acceleration phase, the resilient member will return to its original length thereby generating, again, a position error. Correcting for this error will adversely affect the settle-time of the positioning of the object.

By actuating the second actuator 40, the relative position between the actuator part 35 and the object 30 is controlled. In case the second actuator 40 is a piezo-actuator, a displacement Δx (in the X-direction) of the actuator is realized by controlling the charge applied to it. In case the second actuator is a magneto-strictive actuator, the displacement Δx is realized by controlling the current applied to it. In order to compensate the compression or elongation of the resilient member, the second actuator is driven to realize the following displacement Δx:

$$\Delta x = \frac{F_2}{C} = \frac{M_2}{(M_1 + M_2)} \frac{F_1}{C} \quad (1)$$

wherein:
$F_2$: the force acting on the object 30
$F_1$: the force generated by the first actuator
$M_1$: mass of the actuator part 35
$M_2$: mass of the object 30
C: combined stiffness of the resilient member and the second actuator As shown in equation (1), the deformation of the connector can be described as a function of the stiffness C and the force $F_1$ generated by the first actuator.

Figure 7A:
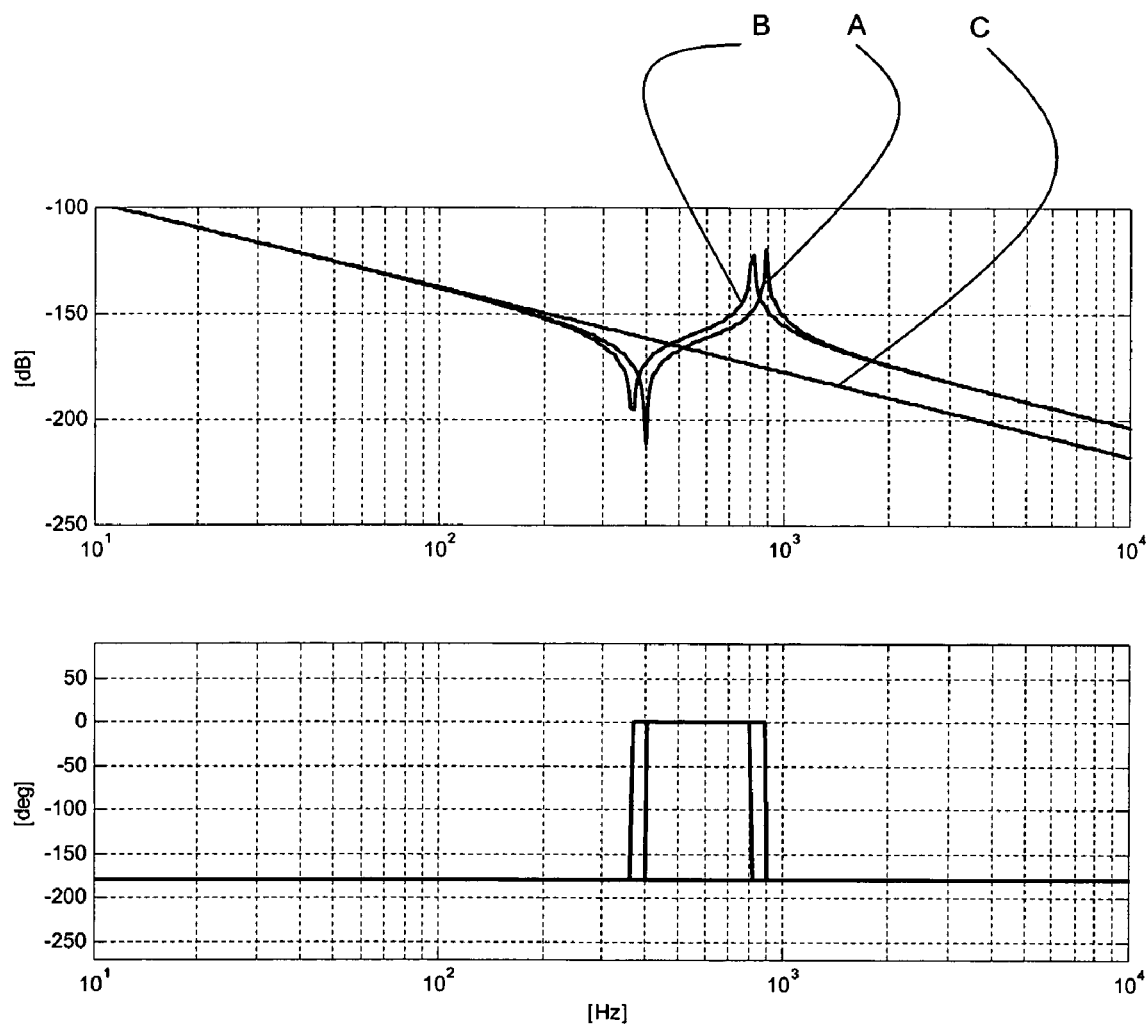
FIG. 7a shows the transfer function x1/F1 of the simulation model.

The following figures show some of the transfer functions of the arrangement shown in FIG. 6. FIG. 7a displays the transfer function x1/$F_1$ (x1 being the X-position of the actuator part 35), FIG. 7b displays the transfer function x2/$F_1$ (x2 being the X-position of the object 30). Both figures display the transfer characteristics for the following situations:

A: transfer functions without the second actuator (stiffness of the resilient member equal to $10^8$ N/m);

B: transfer function with second actuator (actuator stiffness equal to 5*$10^8$ N/m), second actuator not actuated; and C: transfer function with second actuator, second actuator actuated according to eq. (1).

Figure 7B:
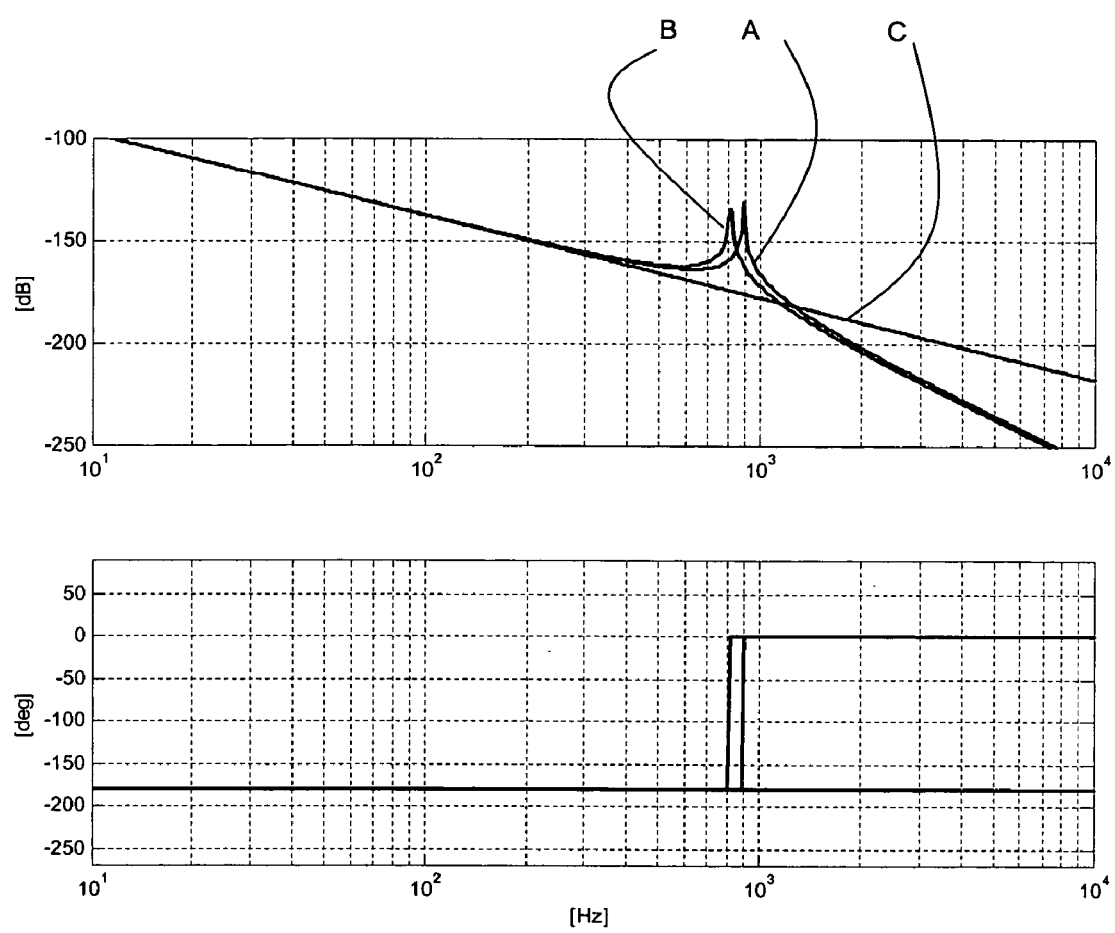
FIG. 7b shows the transfer function x2/F1 of the simulation model.

As can be seen from FIGS. 7a and 7b, the resonance behavior of characteristics A and B is no longer present in characteristic C (i.e. with the activated second actuator). The resulting transfer characteristic C corresponds to that of a $2^{nd}$ order system.

Figure 7C:
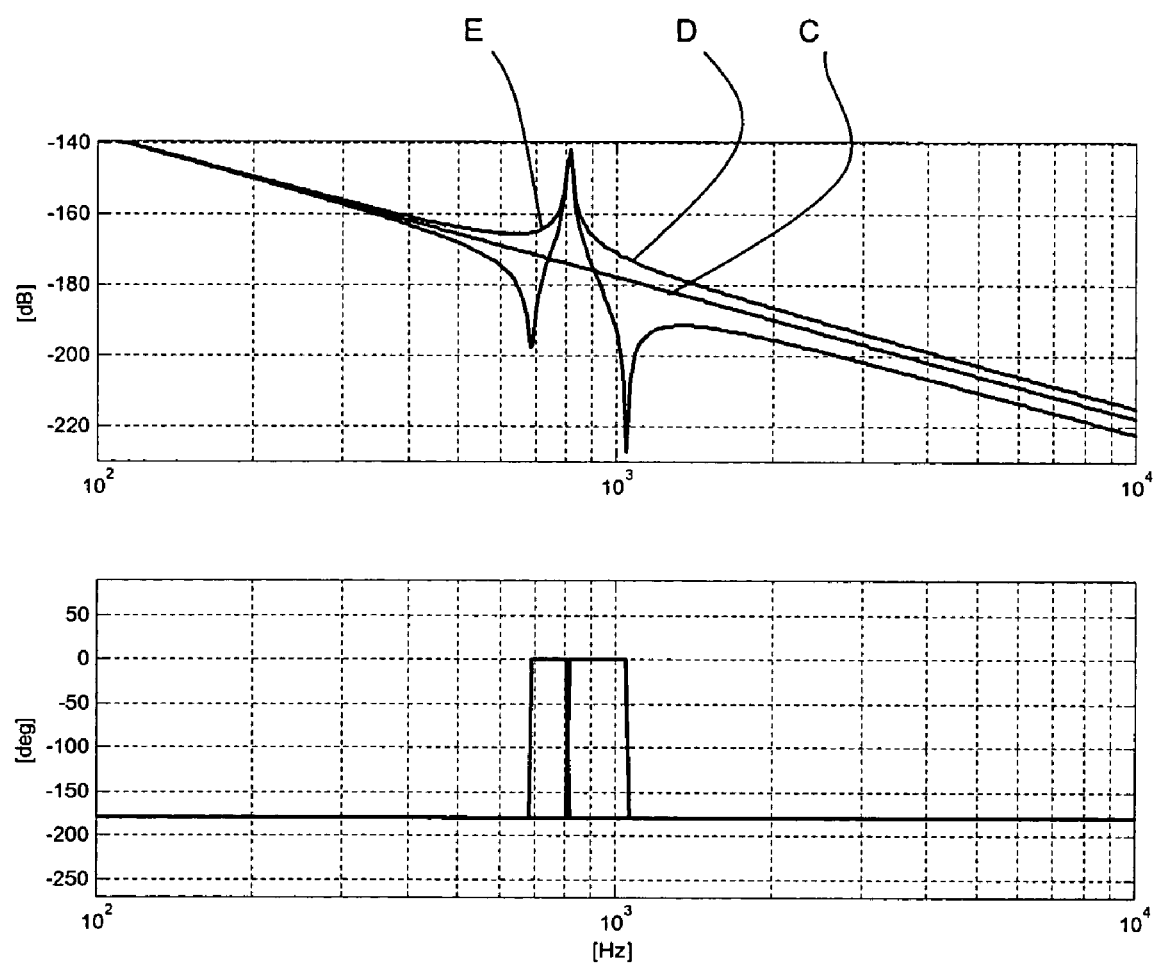
FIG. 7c shows the transfer function x1/F1 of the simulation model for different values of the gain of the second actuator.
Figure 7D:
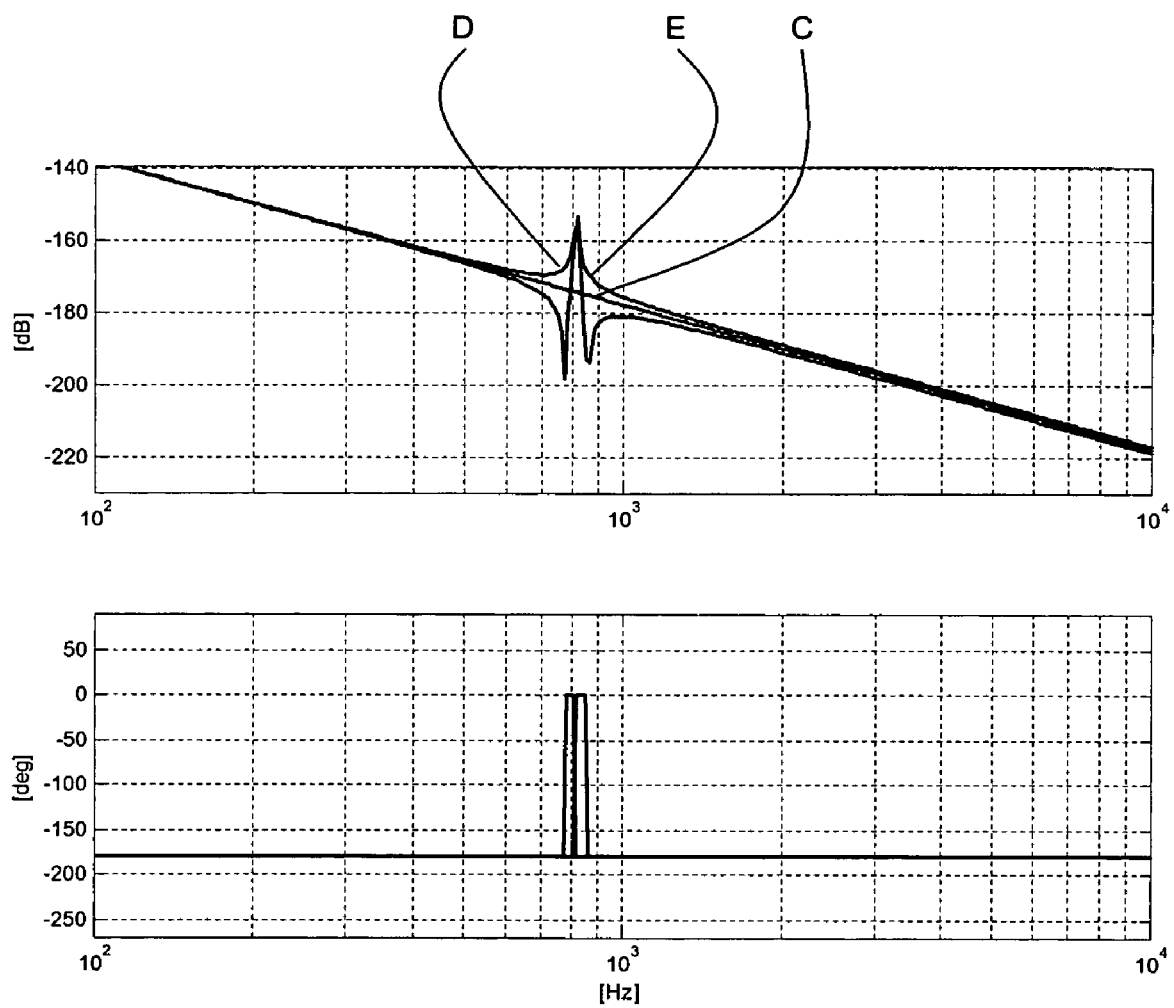
FIG. 7d shows the transfer function x2/F1 of the simulation model for different values of the gain of the second actuator.

FIGS. 7c and 7d also display the transfer function x1/$F_1$ and the transfer function x2/$F_1$ but for the following situations:

C: transfer function with second actuator actuated according to eq. (1);

D: similar to graph C but the gain of the second actuator being 10% smaller; and E: similar to graph C but the gain of the second actuator being 10% larger.

As can be seen from the characteristics, when the second actuator is driven to provide a smaller or larger deformation than the estimated deformation of the connector (according to eq. (1)), a resonance/anti-resonance behavior occurs.

Such a situation may occur in practice when the actual stiffness of either the resilient member or the second actuator (or both) are difficult to asses to a certain accuracy. It may also occur that the actual stiffness varies over time. In practice, it may be preferred the choose the gain of the second actuator in such a way that under all conditions either the behavior according to graph D or the behavior according to graph E occurs. By doing so, the controller can be designed with only one typical characteristic in mind.

Figure 8A:
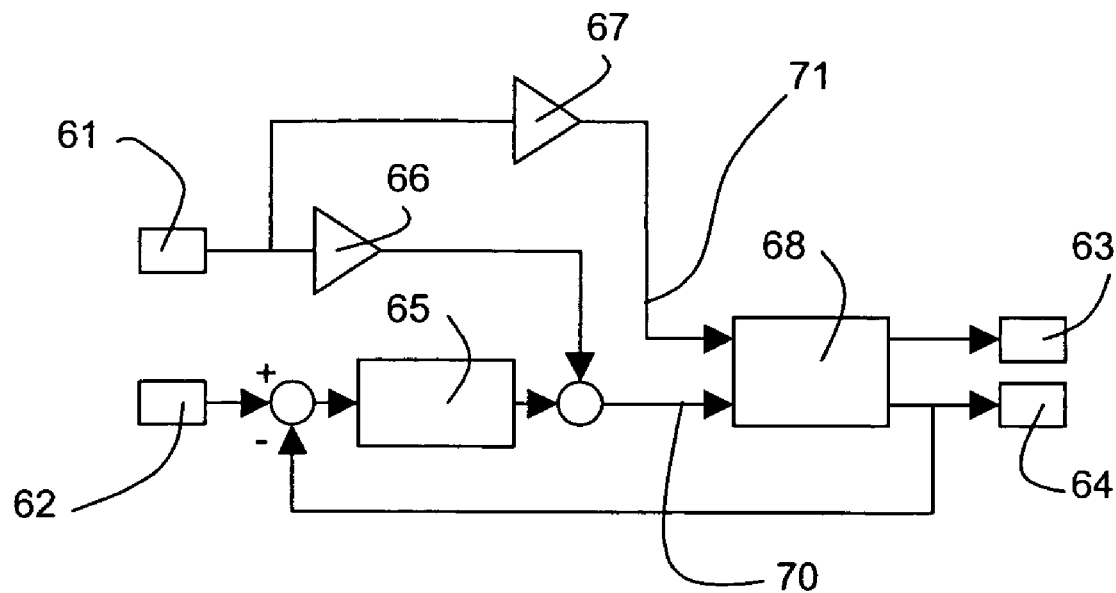
FIGS. 8a and 8b schematically show simulation block schemes used for time-domain simulations.
Figure 8B:
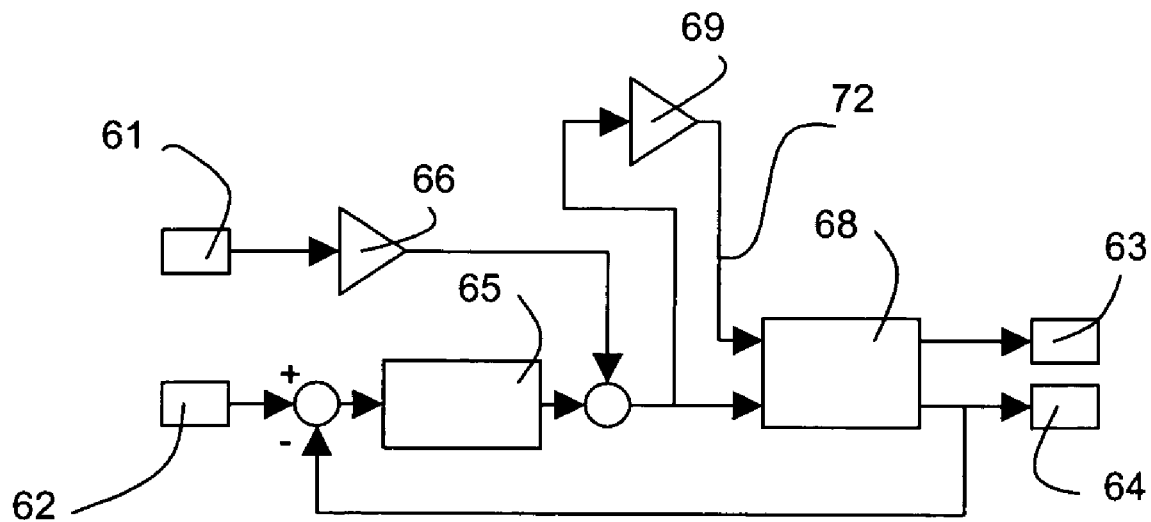

FIGS. 8a and 8b schematically show simulation block schemes that are applied to illustrate the behavior of the present invention in the time-domain. An acceleration setpoint 61 and a position setpoint 62 are applied as input for the simulations. The simulation provides the X-position of $M_1$, 63, and the X-position of $M_2$, 64, as output. Block 65 represents a conventional PID+low-pass-filter controller. The controller calculates the required actuator force based on the position setpoint 62 for $M_2$ and on the actual position of $M_2$ (64). This controller output ($F_c$) is combined with an acceleration feed-forward. The acceleration feed-forward has a gain $K_1$, (66), equal to $M_1+M_2$ resulting in the following acceleration feed-forward force:

$$F_a = (M_1+M_2)*a = K_1*a \quad (2)$$

wherein $F_a$: acceleration feed-forward force $M_1$: mass of the actuator part 35

$M_2$: mass of the object 30 a: required acceleration (as obtained from the acceleration setpoint)

The controller output combined with the acceleration feed-forward provides a first input 70 to the mechanical model 68, representing the force generated by the first actuator. In addition, the mechanical model 68 has an input 71 representing the required displacement Δx of the second actuator. This displacement can be obtained in the following different ways: (a) the displacement can be obtained directly from the required acceleration; or (b) the displacement can be obtained from the total controller output $F_c+F_a$ (i.e. the input force for the first actuator).

In FIG. 8a, the required displacement Δx is obtained from the required acceleration by applying a gain $K_2$ (67) to the acceleration setpoint 61. The gain $K_2$ (67) can be calculated by combining equations (1) and (2):

$$\Delta x = \frac{F_2}{C} = \frac{M_2}{C}*a = K_2*a \quad (3)$$

In FIG. 8b, the required displacement Δx (72) is obtained from the controller output combined with the acceleration feed-forward ($F_c+F_a$) by applying a gain $K_3$ (69) to the controller output. In this case, the gain 69 can be calculated using equation (1) and replacing the force $F_1$ by the total controller output $F_c$ combined with the acceleration feed-forward force $F_a$:

$$\Delta x = \frac{F_2}{C} = \frac{M_2}{(M_1+M_2)*C}*(F_c+F_a) = K_3*(F_c+F_a) \quad (4)$$

In both cases, the displacement is applied to the second actuator in mechanical system 68.

Both methods are simulated and discussed in the following figures. As an alternative, the required displacement of the second actuator can also be controlled by a signal representing the measured force in the resilient member.

Figure 9:
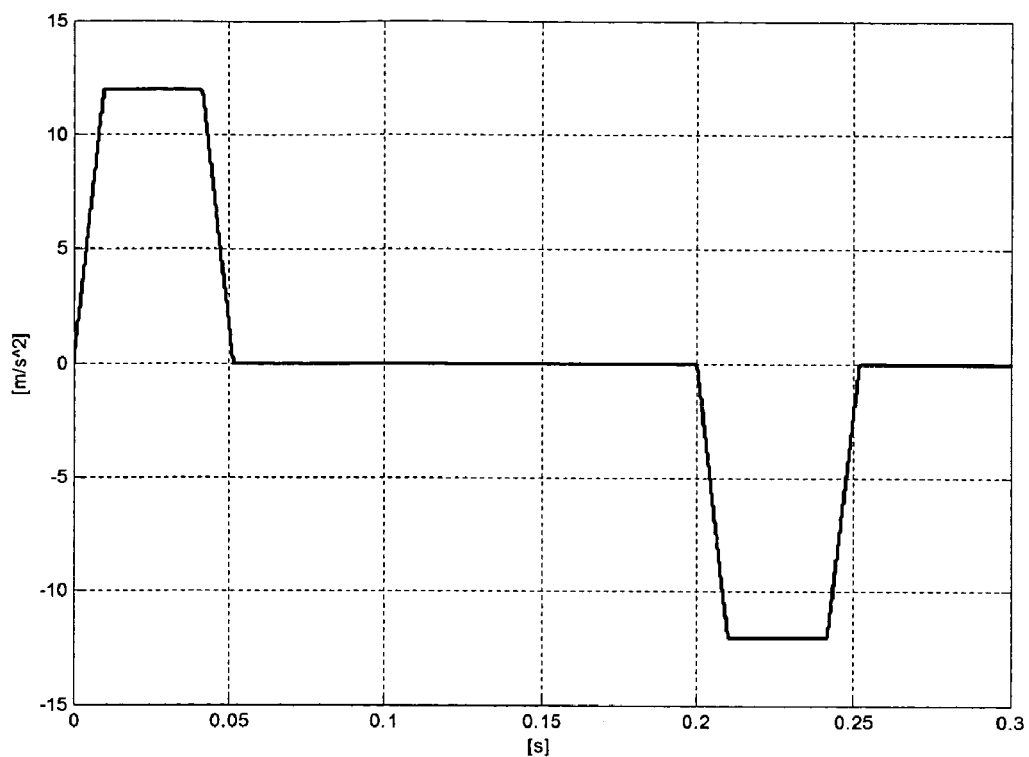
FIG. 9 schematically shows the acceleration profile applied in the simulations.

FIGS. 9 to 13 show the results of a time-domain simulation according to the simulation block schemes of FIGS. 8a and 8b. Starting from a situation with speed=zero, the object $M_2$ is first required to accelerate. This phase is followed by a constant velocity phase. After that, the speed is brought back to zero during a deceleration phase. The acceleration profile is shown in FIG. 9.

Figure 10:
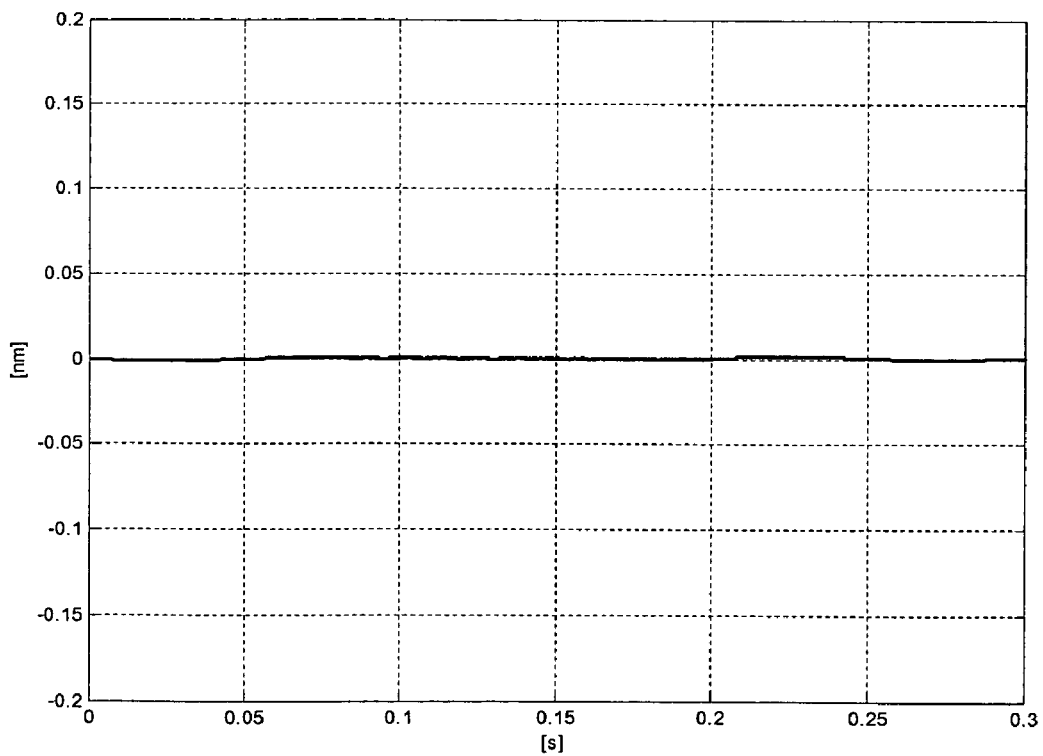
FIG. 10 schematically shows the position error of $M_1$ and $M_2$ when $M_1$ and $M_2$ are rigidly coupled.

FIG. 10 shows the position error of both $M_1$ and $M_2$ over the same time interval as shown in FIG. 9. A controller bandwidth of 100 Hz is used in the simulations. In FIG. 10, both masses $M_1$ and $M_2$ are assumed rigidly coupled to each other, i.e. they behave as one mass. As can be seen from FIG. 10, the occurring position error is substantially zero. This could to be expected since the required acceleration is also applied as input for the simulations.

Figure 11:
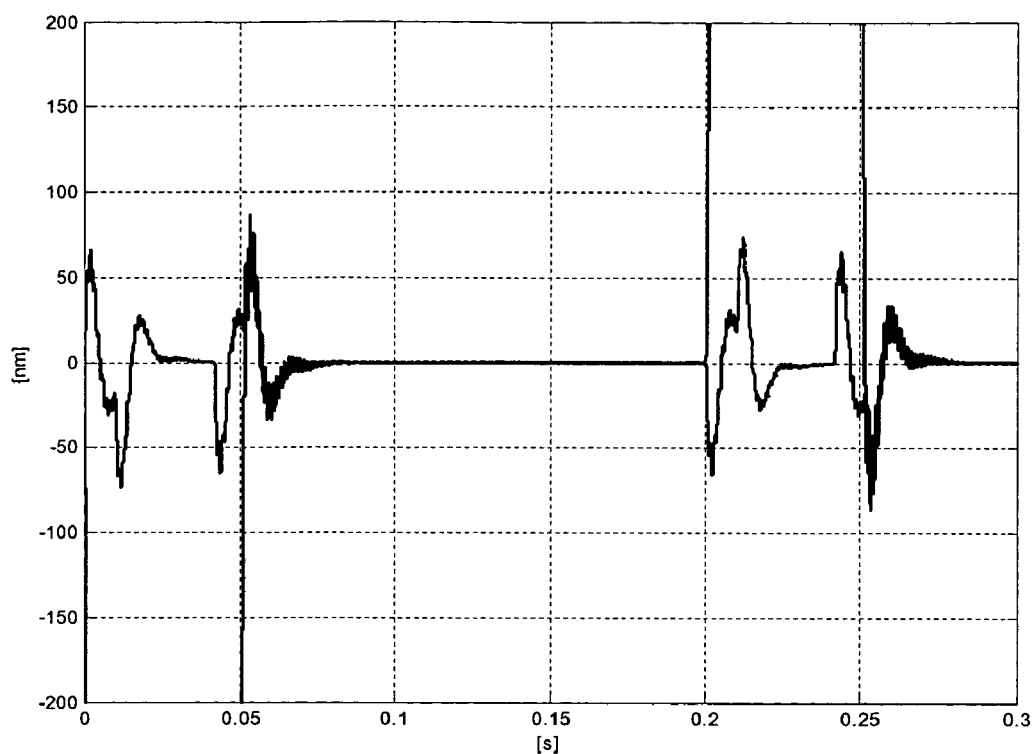
FIG. 11 schematically shows the position error of $M_1$ and $M_2$ when $M_1$ and $M_2$ are coupled by means of a resilient member and a second actuator, the second actuator not active.

In FIG. 11, $M_1$ and $M_2$ are coupled by means of a resilient member with a stiffness $C=10^8$ N/m. As can be seen, both $M_1$ and $M_2$ are not able to follow the position setpoint. The dotted graph in FIG. 11 corresponds to the position error of $M_2$ (i.e. the object 30 that is controlled). The maximum position error is found to be less than 100 nm, (approx. 70 nm) which is relatively small due to the operation of the position controller. The position error of $M_1$ (solid line in FIG. 11) is much worse. The maximum occurring error during simulation is approx. 2.4 μm, being much larger than the error scale applied in FIG. 11.

Figure 12:
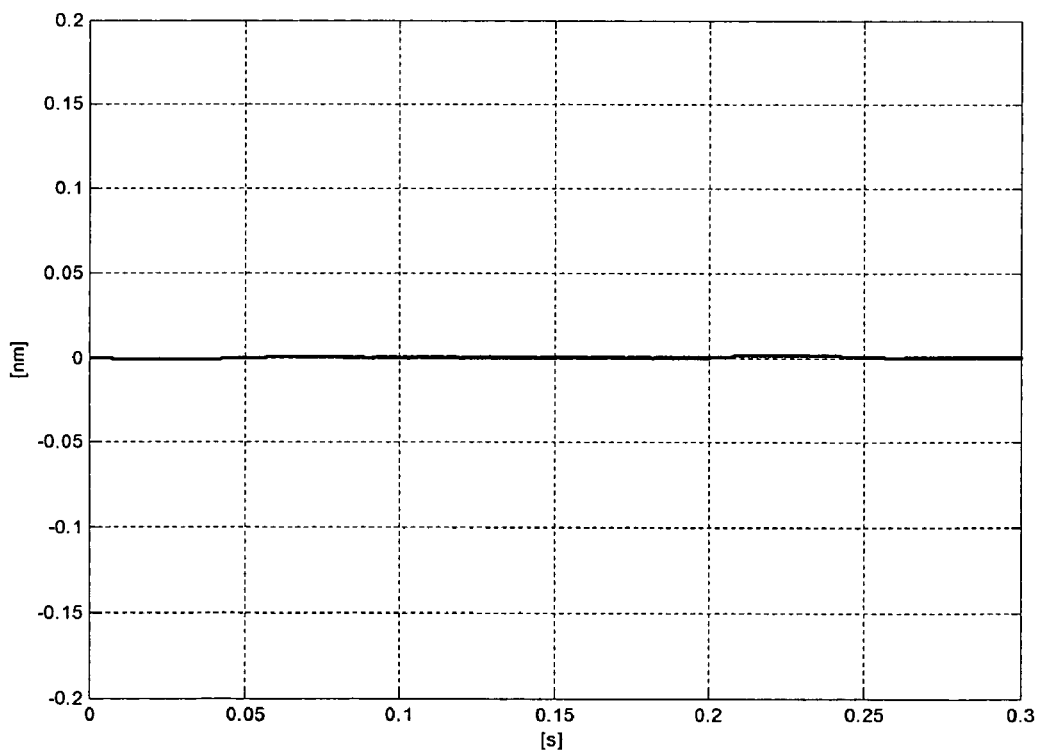
FIG. 12 schematically shows the position error of $M_1$ and $M_2$ when $M_1$ and $M_2$ are coupled by means of a resilient member and a second actuator, the second actuator being controlled by the acceleration setpoint.

FIG. 12 shows the simulation results when the second actuator is present, the displacement of this actuator is feed-forward controlled by the acceleration setpoint, i.e. based on the required acceleration and a gain equal to $K_2=M_2/C$. This corresponds to the simulation block scheme of FIG. 8a. As can be seen from FIG. 12, this approach results in a behavior of both $M_1$ and $M_2$ substantially equal to the behavior depicted in FIG. 10, i.e. both masses behave as if they were rigidly coupled.

Figure 13:
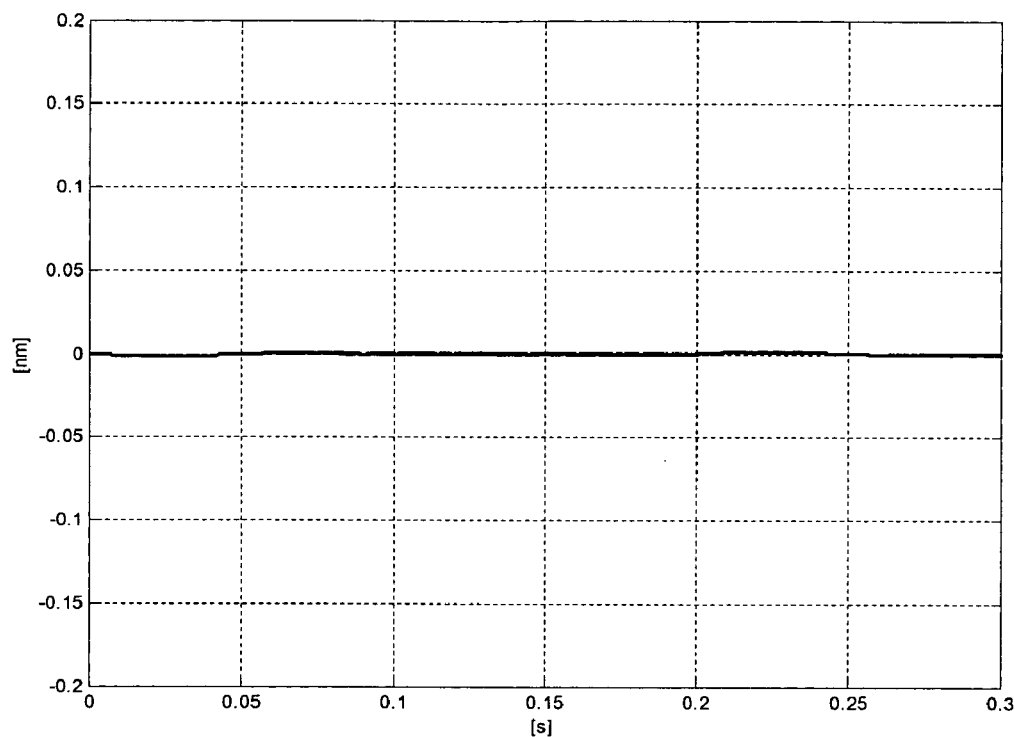
FIG. 13 schematically shows the position error of $M_1$ and $M_2$ when $M_1$ and $M_2$ are coupled by means of a resilient member and a second actuator, the second actuator being controlled by the controller output.

In FIG. 13, the second actuator is also present but controlled by the total controller output. This corresponds to the simulation scheme depicted in FIG. 8b. The difference with the approach shown in FIG. 12 is that contributions of the position controller are also taken into account. When the second actuator is merely controlled by the acceleration setpoint, those contributions are not taken into account. As can be seen from FIG. 13, this approach equally results in a behavior of $M_1$ and $M_2$ as if they were rigidly coupled. (the dynamic behavior is similar to the behavior of the single mass shown in FIG. 10)

As demonstrated in FIGS. 12 and 13, the positioning accuracy of an object can be improved significantly by the introduction of the second actuator that, at least partly, can compensate an occurring deformation of a resilient member between the object and the driving actuator.

Figure 14:
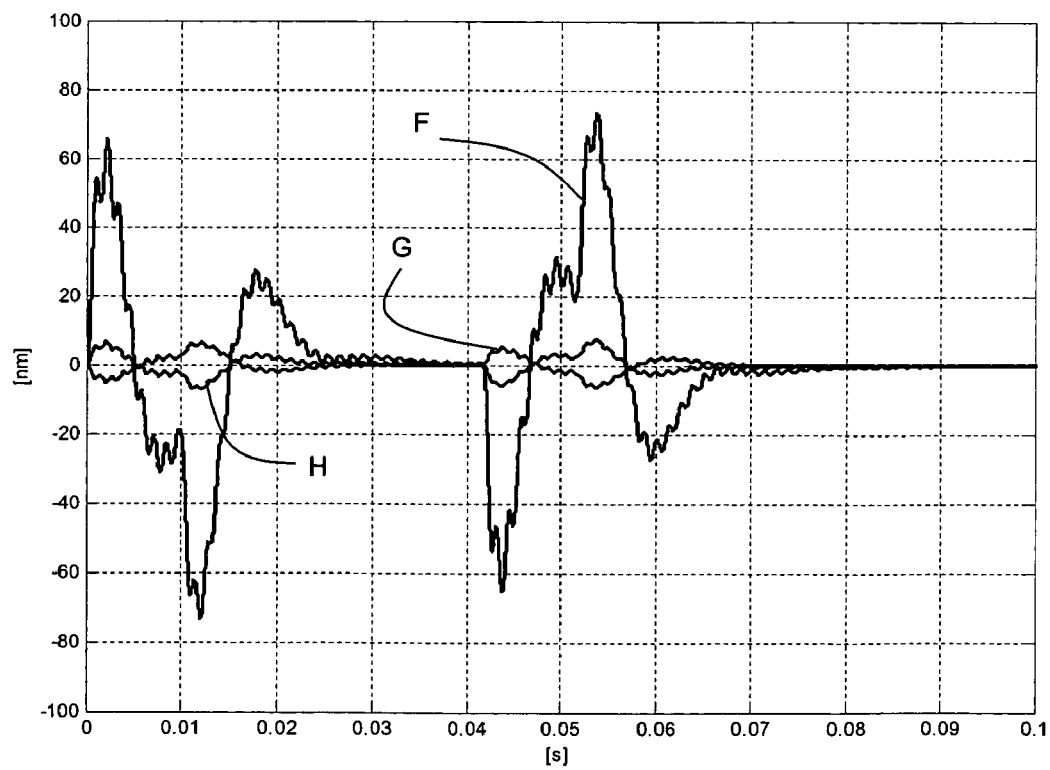
FIG. 14 schematically shows the position error of $M_1$ and $M_2$ when $M_1$ and $M_2$ are coupled by means of a resilient member and a second actuator, the second actuator being controlled by the controller output and having a gain that is 10% smaller or 10% larger compared to FIG. 13.

FIG. 14 shows the simulation results in case the gain of the second actuator is either 10% smaller or 10% larger than the required gain to obtain the appropriate displacement Δx according to eq. (1). Graph F in FIG. 14 corresponds to the dotted graph of FIG. 11 and shows the position error of $M_2$ in case the second actuator is not present. Note that the simulated period is only ⅓th of the period depicted in FIG. 11. Graph G of FIG. 14 shows the position error of $M_2$ in case the second actuator is driven with a gain that is 10% higher than the required gain to obtain the appropriate displacement Δx according to eq. (1).

Graph H of FIG. 14 shows the position error of $M_2$ in case the second actuator is driven with a gain that is 10% smaller than the required gain to obtain the appropriate displacement Δx according to eq. (1). By comparing graphs G and H to graph F, one can conclude that the position error is reduced by approx. 90% (the position error drops from approx. 70 nm to 7 nm) by introducing the second actuator, the gain of the actuator being 10% higher or lower than required according to eq. (1).

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   a radiation system configured to condition a beam of radiation;
   a support structure configured to support a patterning device that imparts a desired pattern to the beam of radiation;
   a substrate holder configured to hold a substrate;
   a projection system configured to project the patterned beam onto a target portion of the substrate; and
   a positioning device configured to position the support structure or the substrate holder, the positioning device comprising:
   a first actuator; and
   a connector comprising a resilient member and a second actuator connected in series with the resilient member, the connector arranged between the first actuator and the support structure or the substrate holder,
   wherein the first actuator is configured to exert a force on the connector along a first direction and the second actuator is configured to control a dimension of its body along the first direction based on information regarding a dimension of the resilient member along the first direction.

2. A lithographic apparatus, comprising:
   a radiation system configured to condition a beam of radiation;
   a support structure configured to support a patterning device that imparts a desired pattern to the beam of radiation;
   a substrate holder configured to hold a substrate;
   a projection system configured to project the patterned beam onto a target portion of the substrate; and
   a positioning device configured to position the radiation system or the projection system, the positioning device comprising:
   a first actuator; and
   a connector comprising a resilient member and a second actuator connected in series with the resilient member, the connector arranged between the first actuator and the radiation system or the projection system,
   wherein the first actuator is configured to exert a force on the connector along a first direction and the second actuator is configured to control a dimension of its body along the first direction based on information regarding a dimension of the resilient member along the first direction.

3. A device manufacturing method, comprising:
   providing a substrate that is at least partially covered by a layer of radiation-sensitive material;
   conditioning a beam of radiation using a radiation system;
   configuring the beam of radiation with a desired pattern in its cross-section based on a patterning device;
   positioning the substrate or the patterning device via a positioning device, the positioning device comprising:
   a first actuator; and
   a connector comprising a resilient member and a second actuator connected in series with the resilient member, the connector arranged between the first actuator and the substrate or the patterning device,
   wherein the first actuator is configured to exert a force on the connector along a first direction and the second actuator is controlled to maintain a distance between the first actuator and the substrate or the patterning device in the first direction substantially constant; and
   projecting the patterned beam of radiation onto a target portion of the substrate.

* * * * *